United States Patent
Fukui et al.

(10) Patent No.: US 9,634,114 B2
(45) Date of Patent: Apr. 25, 2017

(54) TUNNEL FIELD-EFFECT TRANSISTOR, METHOD FOR MANUFACTURING SAME, AND SWITCH ELEMENT

(71) Applicants: NATIONAL UNIVERSITY CORPORATION HOKKAIDO UNIVERSITY, Sapporo-shi, Hokkaido (JP); JAPAN SCIENCE AND TECHNOLOGY AGENCY, Kawaguchi-shi, Saitama (JP)

(72) Inventors: Takashi Fukui, Sapporo (JP); Katsuhiro Tomioka, Sapporo (JP)

(73) Assignees: National University Corporation Hakkaido University, Hakkaido (JP); Japan Science and Technology Agency, Saitama (JP)

( * ) Notice: Subject to any disclaimer, the term of this patent is extended or adjusted under 35 U.S.C. 154(b) by 0 days.

(21) Appl. No.: 14/911,609

(22) PCT Filed: Aug. 12, 2014

(86) PCT No.: PCT/JP2014/004175
§ 371 (c)(1),
(2) Date: Feb. 12, 2016

(87) PCT Pub. No.: WO2015/022777
PCT Pub. Date: Feb. 19, 2015

(65) Prior Publication Data
US 2016/0204224 A1    Jul. 14, 2016

(30) Foreign Application Priority Data
Aug. 13, 2013  (JP) ................................ 2013-168048

(51) Int. Cl.
*H01L 29/06* (2006.01)
*H01L 29/66* (2006.01)
(Continued)

(52) U.S. Cl.
CPC ........ *H01L 29/66522* (2013.01); *B82Y 10/00* (2013.01); *H01L 21/0257* (2013.01);
(Continued)

(58) Field of Classification Search
CPC ......... H01L 29/66522; H01L 21/02538; H01L 21/0257; H01L 21/02603; H01L 21/0262;
(Continued)

(56) References Cited

U.S. PATENT DOCUMENTS 5,679,603 A    10/1997  Kimura et al.
7,776,760 B2 *  8/2010  Taylor .................... B82Y 10/00
                                        257/E21.002
(Continued)

FOREIGN PATENT DOCUMENTS

JP     07-263365 A      10/1995
JP     2013-012723 A    1/2013
(Continued)

OTHER PUBLICATIONS

Katsuhiro Tomioka, Takashi Fukui, "Tunnel field-effect transistor using InAs nanowire/Si heterojunction", Applied Physics Letters, vol. 98, pp. 083114-1-083114-3, Feb. 23, 2011.
(Continued)

*Primary Examiner* — Yasser A Abdelaziez
(74) *Attorney, Agent, or Firm* — Brundidge & Stanger, P.C.

(57) ABSTRACT

A tunnel field-effect transistor (TFET) is configured by disposing a III-V compound semiconductor nano wire on a (111) plane of a IV semiconductor substrate exhibiting p-type conductivity, and arbitrarily disposing electrodes of a source, drain and gate. Alternatively, the tunnel field-effect transistor is configured by disposing a III-V compound semiconductor nano wire on a (111) plane of a IV semiconductor substrate exhibiting n-type conductivity, and arbi-
(Continued)

trarily disposing electrodes of a source, drain and gate. The nano wire is configured from a first region and a second region. For instance, the first region is intermittently doped with a p-type dopant, and the second region is doped with an n-type dopant.

12 Claims, 9 Drawing Sheets

(51) Int. Cl.
    *H01L 21/02* (2006.01)
    *H01L 29/04* (2006.01)
    *H01L 29/08* (2006.01)
    *H01L 29/40* (2006.01)
    *B82Y 10/00* (2011.01)
    *H01L 29/41* (2006.01)
    *B82Y 40/00* (2011.01)

(52) U.S. Cl.
    CPC .... *H01L 21/0262* (2013.01); *H01L 21/02538* (2013.01); *H01L 21/02603* (2013.01); *H01L 29/045* (2013.01); *H01L 29/0676* (2013.01); *H01L 29/0847* (2013.01); *H01L 29/401* (2013.01); *H01L 29/413* (2013.01); *H01L 29/66666* (2013.01); *B82Y 40/00* (2013.01)

(58) Field of Classification Search
    CPC . H01L 29/045; H01L 29/0847; H01L 29/401; H01L 29/413; H01L 29/66666; B82Y 10/00; B82Y 40/00
    USPC ........................................................ 438/198
    See application file for complete search history.

(56) References Cited

U.S. PATENT DOCUMENTS

2004/0132254 A1* 7/2004 Herr ................. B82Y 10/00
    438/291
2012/0187376 A1 7/2012 Tomioka et al.
2012/0298959 A1 11/2012 Verhulst et al.

FOREIGN PATENT DOCUMENTS

WO 2011/040012 A1 4/2011
WO 2013/101172 A1 7/2013

OTHER PUBLICATIONS

Katsuhiro Tomioka, Masatoshi Yoshimura, Takashi Fukui, "Steep-slope tunnel field-effect transistors using III-V nanowire/Si heterojunction" IEEE VLSI Technology 2012 Symposium Proc., pp. 47-48, Jun. 12, 2012.
Katsuhiro Tomioka, Takashi Fukui, "Tunnel field-effect transistor using InAs nanowire/Si heterojunction", Applied Physics Letters, vol. 98, pp. 083114-1-083114-3.
Katsuhiro Tomioka, Masatoshi Yoshimura, Takashi Fukui, "Steep-slope tunnel field-effect transistors using III-V nanowire/Si heterojunction" IEEE VLSI Technology 2012 Symposium Proc., pp. 47-48.
International Search Report from International Application No. PCT/JP2014/004175 mailed Nov. 11, 2014.

* cited by examiner

TUNNEL FIELD-EFFECT TRANSISTOR, METHOD FOR MANUFACTURING SAME, AND SWITCH ELEMENT

TECHNICAL FIELD

The present invention relates to a tunnel field effect transistor having a group III-V compound semiconductor nanowire, a method of manufacturing the transistor, and a switch element including the transistor.

BACKGROUND ART

A tunnel field effect transistor (TFET) uses a tunnel current for switching a transistor. Therefore, a TFET can perform steep on/off switching, and can operate with a low voltage. Examples of such a TFET include a transistor which has a group IV semiconductor substrate and a group III-V compound semiconductor nanowire uprightly provided on the substrate, and generates a tunnel current at an interface between the substrate and the nanowire (see, for example, PTL 1 and Non-PTLS 1 and 2). Advantageously, this TFET can operate with a small subthreshold (60 mV/digit or smaller), and can be readily manufactured. Accordingly, the TFET is suitable for a switch element.

CITATION LIST

Patent Literature

PTL 1
WO2011/040012
Non-PTLs
Non-PTL 1
Katsuhiro Tomioka, Takashi Fukui, "Tunnel field-effect transistor using InAs nanowire/Si heterojunction", Appl. Phys. Lett., Vol. 98, pp. 083114-1-083114-3.
Non-PTL 2
Katsuhiro Tomioka, Masatoshi Yoshimura, Takashi Fukui, "Steep-slope tunnel field-effect transistors using III-V nanowire/Si heterojunction" IEEE VLSI Technology 2012 Symposium Proc., pp. 47-48.

SUMMARY OF INVENTION

Technical Problem

In the TFET, the part forming the interface in the nanowire is formed in an undoped manner; however, the rising voltage of the switch element is shifted to the negative side in some cases. In view of this, in the TFET, it is desired to shift the rising voltage to the positive side.

An object of the present invention is to provide a TFET which can operate with a small subthreshold (60 mV/digit or smaller), and can operate with a more shifted rising voltage on the positive side or the negative side, and moreover, can be readily manufactured. Another object of the present invention is to provide a method of manufacturing the TFET. Still another object of the present invention is to provide a switch element having the TFET.

Solution to Problem

The present inventor found that the above-mentioned problems can be solved by producing a first region, which includes an interface between a group IV semiconductor substrate and a group III-V compound semiconductor nanowire in the group III-V compound semiconductor nanowire, by intermittently doping a suitable dopant at a suitable interval, and the present inventor completed the present invention as a result of further studies.

That is, a first aspect of the present invention relates to a tunnel field effect transistor (TFET) and a switch element described below.

[1] A tunnel field effect transistor including: a group IV semiconductor substrate including a portion of a first conductivity type that is one of n-type and p-type, the portion including a (111) surface; a group III-V compound semiconductor nanowire including a first region uprightly provided on the (111) surface, and a second region of a second conductivity type that is the other of the n-type and the p-type, the second region being continuous from the first region; one of a source electrode and a drain electrode which is not in contact with the group III-V compound semiconductor nanowire and is connected with the group IV semiconductor substrate; the other of the source electrode and the drain electrode which is connected with the second region; and a gate electrode configured to apply an electric field for controlling flow of a carrier between the source electrode and the drain electrode to an interface between the group IV semiconductor substrate and the first region. The first region contains either one or both of a first conductivity type dopant for setting the group III-V compound semiconductor to the first conductivity type and a second conductivity type dopant for setting the group III-V compound semiconductor to the second conductivity type; and at least one of the first conductivity type dopant and the second conductivity type dopant in the first region has a concentration that is equal to or greater than $1 \times 10^{14}$ cm$^{-3}$ and is smaller than a concentration of the second conductivity type dopant in the second region.

[2] The tunnel field effect transistor according to [1] further including a gate dielectric film disposed on at least a side surface in the first region of the group III-V compound semiconductor nanowire. The gate electrode is disposed on the gate dielectric film.

[3] A switch element including: the tunnel field effect transistor according to [1] or [2].

Further, a second aspect of the present invention relates to a method of manufacturing a tunnel field effect transistor (TFET) described below.

[4] A method of manufacturing a tunnel field effect transistor including: growing a group III-V compound semiconductor nanowire on a (111) surface of a portion of a first conductivity type of a group IV semiconductor substrate, the first conductivity type being one of n-type and p-type; forming a gate electrode configured to apply an electric field for controlling flow of a carrier between a source electrode and a drain electrode to an interface between the group IV semiconductor substrate and the group III-V compound semiconductor nanowire; forming one of the source electrode and the drain electrode on the group IV semiconductor substrate such that the one of the source electrode and the drain electrode is not in contact with the group III-V compound semiconductor nanowire; and forming the other of the source electrode and the drain electrode on the group III-V compound semiconductor nanowire. The growing further includes: forming either one of both of a first region by intermittently doping a first conductivity type dopant for setting the group III-V compound semiconductor to the first conductivity type and a second conductivity type dopant for setting the group III-V compound semiconductor to a second conductivity type on the (111) surface while supplying a group III raw material and a group V raw material; and forming a second region of the second conductivity type by further supplying the group V raw material and the group III raw material to the first region formed on the (111) surface, the second region being the other of the n-type and the p-type and being continuous from the first region.

[5] In the method according to [4], the first region contains the second conductivity type dopant for setting the group III-V compound semiconductor to the second conductivity type; and in the forming of the first region, the first conductivity type dopant is intermittently supplied to the (111) surface such that a concentration of the first conductivity type dopant in the first region is $1 \times 10^{14}$ to $1 \times 10^{17}$ cm$^{-3}$.

[6] In the method according to [4] or [5], in the forming of the first region, the first conductivity type dopant is doped for 0.1 to 5 seconds per doping at an interval of 1.0 to 29.5 seconds.

[7] In the method according to any one of [4] to [6], in the forming of the second region, the second region of the second conductivity type is formed by doping the second conductivity type dopant to the first region formed on the (111) surface while supplying the group V raw material and the group III raw material.

Advantageous Effects of Invention

According to the present invention, it is possible to provide a TFET which can operate with a small subthreshold (60 mV/digit or smaller), and can operate with a more shifted rising voltage on the positive side or the negative side. The TFET of the present invention can be readily manufactured. With use of the TFET of the present invention, it is possible to improve a degree of integration and performance of a semiconductor microprocessor and a large scale integrated circuit while suppressing an increase in power consumption of the semiconductor microprocessor and the large scale integrated circuit.

DESCRIPTION OF EMBODIMENT

Figure 1:
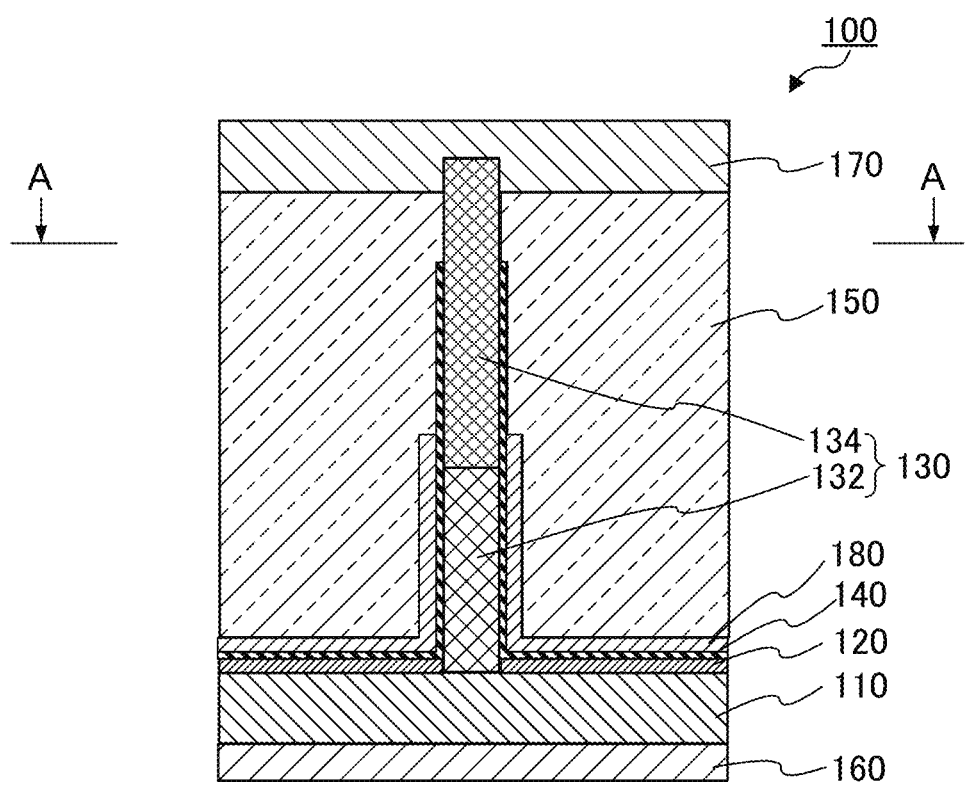
FIG. 1 is a sectional view schematically illustrating a configuration of a TFET of an embodiment.

1. Tunnel Field Effect Transistor of the Present Invention

A tunnel field effect transistor (TFET) according to the present invention includes a group IV semiconductor substrate, a group III-V compound semiconductor nanowire, a source electrode, a drain electrode and a gate electrode. A plurality of TFETs may be formed on one group IV semiconductor substrate. In the TFET of the present invention, a (111) surface of the group IV semiconductor substrate and a nanowire arranged on the (111) surface of the group IV semiconductor substrate form an interface (hereinafter also referred to as "junction interface"). In the TFET of the present invention, a tunnel phenomenon occurs at this junction interface. It is to be noted that the "junction interface" refers to a part where the group III-V compound semiconductor nanowire is directly connected with the (111) surface.

The group IV semiconductor substrate is a substrate having a (111) surface and made of group IV semiconductor, such as a silicon substrate or a germanium substrate. The group IV semiconductor substrate is, for example, a silicon (111) substrate or a silicon (100) substrate. When the group IV semiconductor substrate is a silicon (100) substrate, a (111) surface is formed apart from the (100) surface.

The group IV semiconductor substrate has a portion including the (111) surface. This portion is of n-type or p-type. The conductivity type of this portion is also referred to as "first conductivity type." Therefore, a portion including the (111) surface of the group IV semiconductor substrate may have the first conductivity type, or the entirety of the group IV semiconductor substrate may have the first conductivity type. For example, the group IV semiconductor substrate may also be a group IV semiconductor substrate including a group IV semiconductor layer whose end face is a (111) surface. In addition, the group IV semiconductor substrate may be doped to be an n-type or p-type. As a dopant doped to the group IV semiconductor substrate, a dopant that sets the substrate to n-type or p-type is used. For example, examples of the dopant that sets the group IV semiconductor substrate to p-type include B, Al, Ga, In and Tl. In addition, examples of the dopant that sets the group IV semiconductor substrate to n-type include N, P, As, Sb and Bi.

Furthermore, an insulating film may be formed on the surface of the group IV semiconductor substrate. Examples of the insulating film include a silicon oxide film, and a film including a compound having a dielectric constant of 3.9 or greater. Examples of the compound having a dielectric constant of 3.9 or greater include silicon nitride and HfAlO.

The group III-V compound semiconductor nanowire is a structure made of a group III-V compound semiconductor having a diameter of 2 to 100 nm and a length of 50 nm to 10 μm. For example, the group III-V compound semiconductor nanowire is arranged on the (111) surface of the group IV semiconductor substrate such that a longitudinal axis thereof is perpendicular to the (111) surface. The group III-V compound semiconductor may be any one of semiconductor made of two elements, semiconductor made of three elements, semiconductor made of four elements and semiconductor made of more than four elements.

Examples of the group III-V compound semiconductor made of two elements include InAs, InP, GaAs, GaN, InSb, GaSb and AlSb. Examples of the group III-V compound semiconductor made of three elements include AlGaAs, InGaAs, InGaN, AlGaN, GaNAs, InAsSb, GaAsSb, InGaSb and AlInSb. Examples of the group III-V compound semiconductor made of four or more elements include InGaAlN, AlInGaP, InGaAsP, GaInAsN, InGaAlSb, InGaAsSb and AlInGaPSb.

The group III-V compound semiconductor nanowire includes a first region and a second region. The first region is a portion that is joined to the (111) surface of the group IV semiconductor substrate and is uprightly provided on the (111) surface. The second region is a portion that is continuous from the first region. For example, in the longitudinal direction of the group III-V compound semiconductor nanowire, the first region is a portion provided on the substrate side, and the second region is a portion provided on the side opposite to the substrate side.

The first region contains a first conductivity type dopant for shifting a gate voltage described later. That is, the first region includes the first conductivity type dopant for setting the group III-V compound semiconductor to the first conductivity type, or a second conductivity type dopant for setting the group III-V compound semiconductor to the second conductivity type, or both. For example, the first region may be composed of a group III-V compound semiconductor which is of i-type in a non-doped state in which the first conductivity type dopant, or the second conductivity type dopant or both is doped. In addition, the first region may be formed by doping either one or both of the first conductivity type dopant and the second conductivity type dopant into a group III-V compound semiconductor having the property of n-type by doping an unintended dopant there into although the group III-V compound semiconductor has the property of p-type in a non-doped state. Further, the first region may be formed by doping either one or both of the first conductivity type dopant and the second conductivity type dopant into a group III-V compound semiconductor having the property of p-type by doping an unintended dopant there into although the group III-V compound semiconductor has the property of n-type in a non-doped state.

The concentration of the first conductivity type dopant and the second conductivity type dopant in the first region may be appropriately set in a range between a concentration which is effective as a dopant when the first conductivity type dopant or the second conductivity type dopant is singly doped, and a concentration at which the influence of one of the dopants can be substantially canceled with the other of the dopants in the first region. For example, the concentration of at least one of the first conductivity type dopant and the second conductivity type dopant in the first region is equal to or greater than $1 \times 10^{14}$ cm$^{-3}$ and is smaller than the concentration of the second conductivity type dopant in the second region.

In addition, in the case where the first region includes both the first conductivity type dopant and the second conductivity type dopant, the concentration of one of the first conductivity type dopant and the second conductivity type dopant is preferably smaller than that of the other of the first conductivity type dopant and the second conductivity type dopant, from the viewpoint of substantially cancelling the influence of one of the dopants by the other of the dopants. For example, in the case where the first conductivity type dopant is doped to the first region of the group III-V compound semiconductor which is the second conductivity type with the presence of unintended dopant although the group III-V compound semiconductor has the property of i-type in a non-doped state, the concentration of the first conductivity type dopant is smaller than the concentration of the second conductivity type dopant in the second region, and is, preferably, smaller than the concentration of the second conductivity type dopant in the first region when the doping of the first conductivity type dopant is intended to suppress the second conductivity type set by unintended doping.

Disadvantageously, when the concentration of the first conductivity type dopant is excessively small, the conductivity type of the first region may not appropriately be controlled, and when the concentration of the first conductivity type dopant is excessively large, the actual junction interface is the interface between the first region and the second region. Both the concentration of the first conductivity type dopant and the concentration of the second conductivity type dopant can be determined by forming an InAs nanowire in a non-doped state on a silicon substrate of n-type, p-type or i-type to produce a vertical FET structure, and calculating the concentration from the threshold voltage of the nanowire. Such a first region can be formed by intermittently doping the first conductivity type dopant described later, for example. For the above-mentioned reason, the concentration of the first conductivity type dopant in the first region is preferably $1 \times 10^{14}$ to $1 \times 10^{17}$ cm$^{-3}$.

One or more kinds of the first conductivity type dopant may be used. Examples of the first conductivity type dopant for setting the first region to p-type include Zn, Cd, Hg, Te and C. Examples of the first conductivity type dopant for setting the first region to n-type include C, Si, Ge, Sn, O, S, Se and Po.

From the viewpoint of appropriately adjusting the conductivity type of the first region, the first conductivity type dopant is preferably a dopant for setting the group III-V compound semiconductor to a conductivity type opposite to the conductivity type of the group III-V compound semiconductor in which the first conductivity type dopant is not doped. That is, a first conductivity type dopant of p-type is preferable for a group III-V compound semiconductor of n-type, and a first conductivity type dopant of n-type is preferable for a group III-V compound semiconductor of p-type. Here, the "group III-V compound semiconductor in which the first conductivity type dopant is not doped" includes a group III-V compound semiconductor which becomes a specific conductivity type when an unintended dopant is doped (mixed). Such a first conductivity type dopant can be determined by forming the first region without doping the first conductivity type dopant, and measuring the conductivity type of the first region, for example.

The second region is of a conductivity type of one of n-type and p-type, which is opposite to the first conductivity type. The conductivity type of the second region is also referred to as "second conductivity type." The second region of the second conductivity type can be formed by doping the second conductivity type dopant. One or more kinds of the second conductivity type dopant may be used. The second conductivity type dopant is selected from among the dopants exemplified as the examples of the first conductivity type dopant.

The source electrode is connected to the source region of the TFET of the present invention and the drain electrode is connected to the drain region of the TFET of the present invention. Examples of the source electrode and the drain electrode include a Ti/Au alloy film, a Ti/Al/Ti/Au alloy film, a Ge/Au/Ni/Au alloy film and the like.

The positions of the source electrode and the drain electrode differ depending on the structure of the TFET of the present invention. For example, in the case where the group IV semiconductor substrate functions as a source region, the first region (in connection with the (111) surface of the group IV semiconductor substrate) of the group III-V compound semiconductor nanowire functions as a channel region, and the second region (region other than the first region) of the group III-V compound semiconductor nanowire functions as a drain region, the source electrode is connected with the group IV semiconductor substrate, and the drain electrode is connected with the second region of the group III-V compound semiconductor nanowire.

In the case where the group IV semiconductor substrate functions as a drain region, the first region (in connection with the (111) surface of the group IV semiconductor substrate) of the group III-V compound semiconductor nanowire functions as a channel region, and the second region (region other than the first region) of the group III-V compound semiconductor nanowire functions as a source region, the source electrode is connected with the second region of the group III-V compound semiconductor nanowire, and the drain electrode is connected with the group IV semiconductor substrate.

The gate electrode can apply an electric field to the junction interface. Normally, a gate dielectric film is arranged in the channel region (group IV semiconductor substrate and/or group III-V compound semiconductor nanowire) and the gate electrode is arranged on the gate dielectric film.

As long as the effect of the present invention can be obtained, the TFET of the present invention may further include components other than the above-described components. For example, the TFET of the present invention may further include an insulation protective film. The insulation protective film is arranged such that its thickness direction is aligned with the longitudinal axial direction of the group III-V compound semiconductor nanowire. The insulation protective film may be arranged on the entire group IV semiconductor substrate, or on a part of the group IV semiconductor substrate. From the viewpoint of protecting the group III-V compound semiconductor nanowire, the gate dielectric film and the gate electrode, it is preferable that the insulation protective film have a thickness enough to cover at least a part of the first region and the second region of the group III-V compound semiconductor nanowire. From a view point of sufficiently obtaining electrical insulation property and performing formation with a solution having a low viscosity which does not bend the nanowire, it is preferable that the insulation protective film be a BCB (benzocyclobutene) layer.

In the TFET of the present invention, the junction interface preferably has neither dislocation nor defect, but may have small dislocation or defect. To be more specific, the period of misfit dislocation at the junction interface needs only to be longer than the period of misfit dislocation calculated from lattice mismatch between the group IV semiconductor and the group III-V compound semiconductor. Furthermore, the density of threading dislocation at the junction interface needs only to fall within a range of 0 to $10^{10}$ dislocations/cm$^2$. By manufacturing the TFET of the present invention using the method of manufacturing a TFET according to the present invention, which will be described later, it is possible to manufacture the TFET of the present invention having the junction interface basically including neither dislocation nor defect.

Figure 5A:
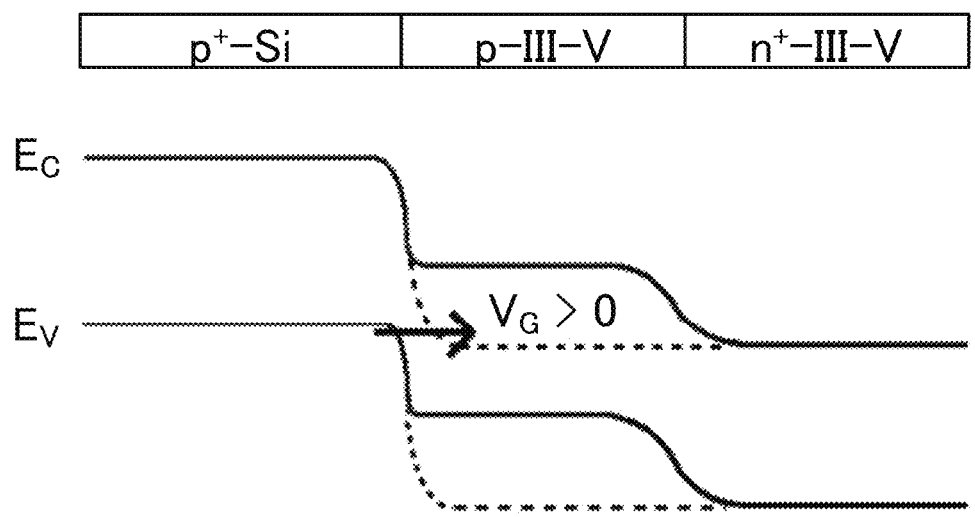
FIG. 5A schematically illustrates an example of a band structure of the TFET of the embodiment.
Figure 5B:
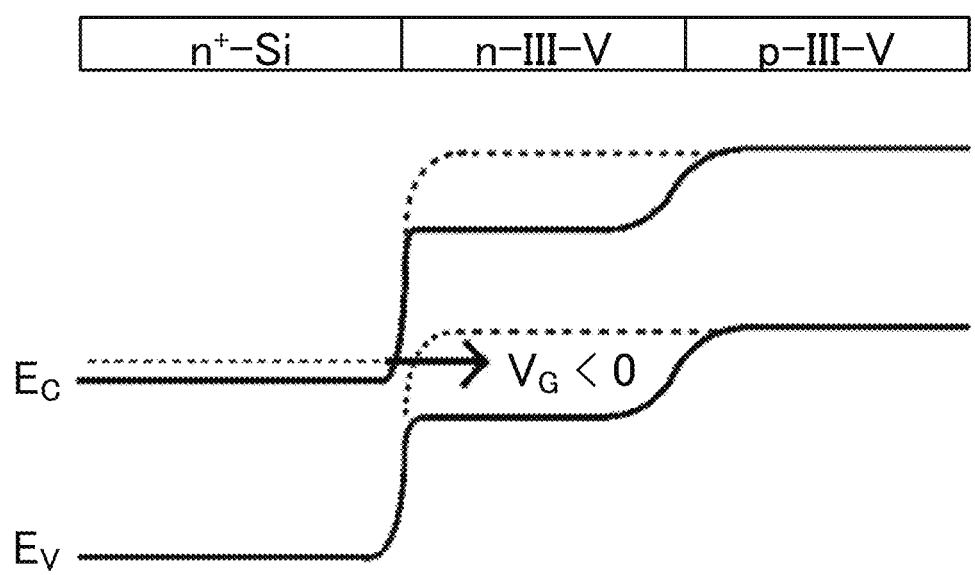
FIG. 5B schematically illustrates an example of a band structure of a TFET of the other embodiment.

In the TFET of the present invention, the junction interface functions as a tunnel layer. As described in the embodiment later, in the TFET of the present invention, a positive or negative bias is applied to the gate electrode and thus the carrier in the source region (the group IV semiconductor substrate or the group III-V compound semiconductor nanowire) moves into the channel region (the group III-V compound semiconductor nanowire or the group IV semiconductor substrate) (ON state is established) through a tunnel phenomenon. This operation corresponds to a switch operation of an n-type or p-type MOSFET of a CMOS switch (FIG. 5A and FIG. 5B).

The TFET of the present invention can operate at a subthreshold of 60 mV/digit or smaller by using a potential produced at the junction interface between the group IV semiconductor substrate and the group III-V compound semiconductor nanowire (see Examples). Power consumption of the semiconductor device can be reduced by using the TFET of the present invention as a switch element. As a result, power saving and reduction of environmental load can be achieved.

Figure 7:
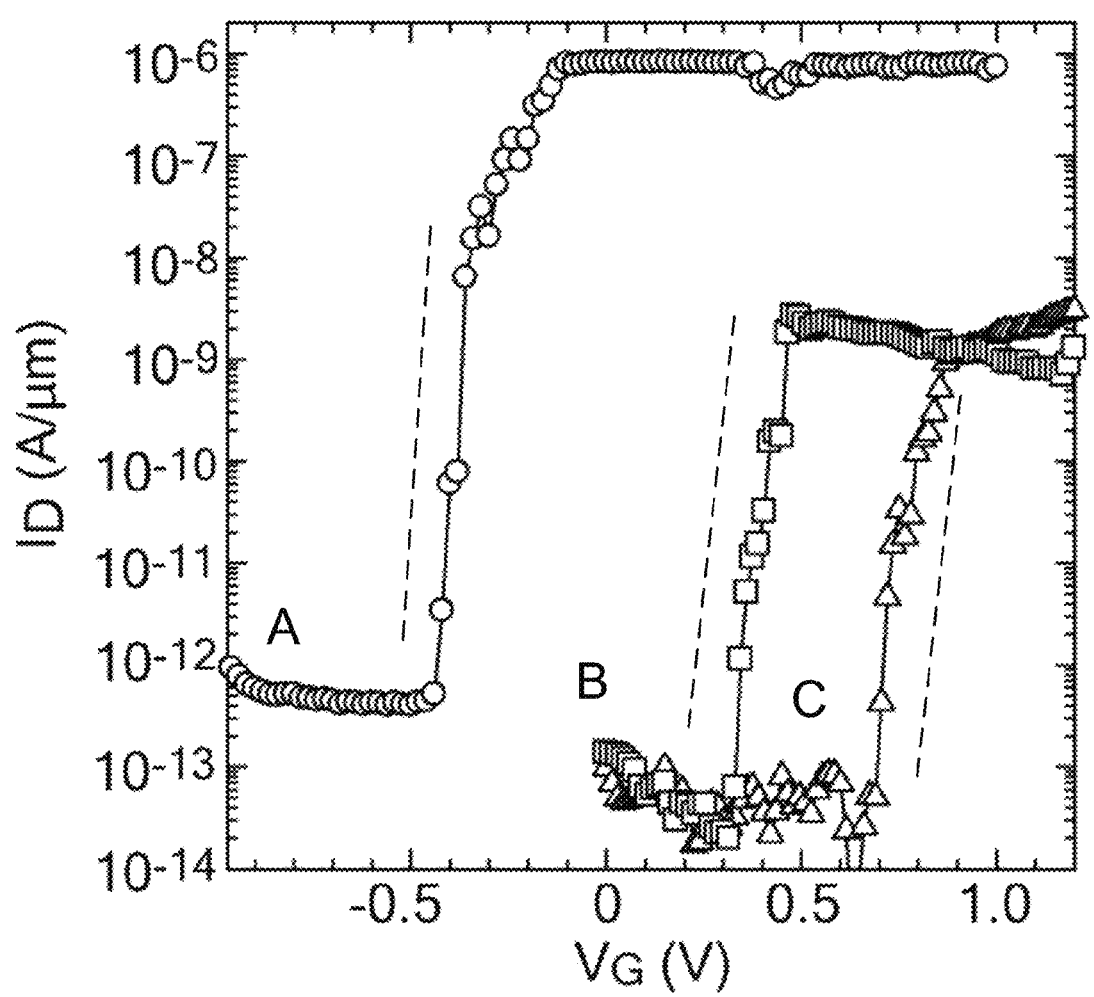
FIG. 7 shows relationships between the drain current and the gate voltage in TFETs of Examples 1 and 2 and a conventional TFET (of Comparative example 1)

In addition, in the TFET of the present invention, by appropriately adjusting the conductivity type of the first region of the group III-V compound semiconductor nanowire, the threshold voltage is shifted to the positive side or the negative side. In this manner, by appropriately adjusting the conductivity type of the first region, the polarity and the value of the voltage (gate voltage) to be supplied required for the ON state can be arbitrarily controlled (FIG. 7).

2. Manufacturing Method of TFET of the Present Invention

A manufacturing method of the TFET of the present invention includes a nanowire growth step, a gate electrode formation step, a step of forming a source electrode and a drain electrode.

The "nanowire growth step" is a step of growing a group III-V compound semiconductor nanowire on a (111) surface of the first conductivity type of the group IV semiconductor substrate. The "gate electrode formation step" is a step of forming a gate electrode for generating the electric field for controlling the flow of a carrier between the source electrode and the drain electrode. The gate electrode is arranged in such a manner as to act at the interface of the group IV semiconductor substrate and the group III-V compound semiconductor nanowire. The "step of forming a source electrode and a drain electrode" is a step of forming one of the source electrode and the drain electrode on the group IV semiconductor substrate and forming the other of the source electrode and the drain electrode on the group III-V compound semiconductor nanowire in such a manner as not to contact with the group III-V compound semiconductor nanowire.

The steps other than the nanowire growth step can be performed based on conventional techniques in accordance with the method disclosed in PTL 1 for example.

In a manufacturing method of the TFET of the present invention, a preprocessing step of the group IV semiconductor substrate can be performed prior to the "nanowire growth step" as necessary. Examples of such a preprocessing step include a step of forming an insulating film having an opening.

Examples of the group IV semiconductor substrate having (111) surface on which to form the insulating film include an n-type silicon (111) substrate, a p-type silicon (111) substrate, and a silicon (100) substrate whose (111) surface is wholly or partly exposed by anisotropic etching on the surface. The silicon oxide film as an insulating film can be formed by thermal oxidization of a silicon substrate or by a commonly used method for forming a thin film such as a sputtering method, for example. The thickness of the insulating film is not limited, and may be about 20 nm, for example.

The opening of the insulating film can be formed using a fine patterning technique such as electron beam lithography, photolithography, nanoimprint lithography or the like. The shape of the opening can be arbitrarily determined, and examples of the shape of the opening include a triangular shape, a quadrangular shape, a hexagonal shape and a circular shape. The diameter of the opening may be, for example, about 2 to 100 nm. When the diameter of the opening is excessively large, multiple dislocations or defects may be formed at the junction interface. When a plurality of openings are periodically arrayed on one group IV semiconductor substrate, the interval of openings is about 10 nm to several micro meters.

In addition, examples of the preprocessing step include a high-temperature heat treatment. The high-temperature heat treatment is a treatment for removing a natural oxide film formed on the (111) surface of the group IV semiconductor substrate. The natural oxide film inhibits the growth of the group III-V compound semiconductor nanowire. The natural oxide film is removed by performing the high-temperature heat treatment on the group IV semiconductor substrate provided with the opening. When the natural oxide film is removed, the surface ((111) surface in the opening) of the group IV semiconductor substrate is exposed. The high-temperature heat treatment can be performed under a condition of approximately 900° C. in an atmosphere of inert gas such as nitrogen gas and argon gas, and hydrogen gas.

In addition, examples of the preprocessing step include a low-temperature heat treatment. The low-temperature heat treatment is a treatment for reducing the temperature of the group IV semiconductor substrate after the high-temperature heat treatment to a temperature of growth of the group III-V compound semiconductor nanowire or below, for example, to about 400° C. to set the (111) surface of the group IV semiconductor substrate to a (111) 1×1 surface.

While the (111) surface after the high-temperature heat treatment is typically configured in a 1×1 structure, the (111) surface may possibly be converted to the (111) 2×1 surface during cooling down in some cases. However, by reducing the temperature of the group IV semiconductor substrate to about 400° C., the (111) 2×1 surface can be again converted to the (111) 1×1 surface. It is to be noted that the "(111) 2×1 surface" refers to a surface where the minimum unit of an atomic array is 2-atom distance×1-atom distance. The "(111) 1×1 surface" refers to a surface where the minimum unit of an atomic array is 1-atom distance×1-atom distance.

The low-temperature heat treatment may be performed at approximately 350 to 450° C. (for example, approximately 400° C.). The low-temperature heat treatment is preferably performed under an atmosphere of inert gas such as hydrogen gas, nitrogen gas, argon gas, and helium gas.

Further, in the manufacturing method of the TFET of the present invention, a preparation step of growing the nanowire can be performed during the "nanowire growth step" as necessary. Examples of such a preparation step include a step of converting the (111) surface to a (111) A surface or to a (111) B surface. The "(111) A surface" refers to a surface where a group III element is disposed on the surface. In addition, the "(111) B surface" refers to a surface where a group V element is disposed on the surface. The (111) A surface or the (111) B surface of the group III-V compound semiconductor has a structure in which a (111) 2×2 surface, that is, the minimum unit, is configured at a period of 2-atom distance×2-atom distance. Thus, when a group III element or a group V element is arranged in a minimum unit smaller than the 2-atom distance×2-atom distance on the surface of the group IV semiconductor substrate, the group III-V compound semiconductor can easily grow on the surface.

Figure 4A:
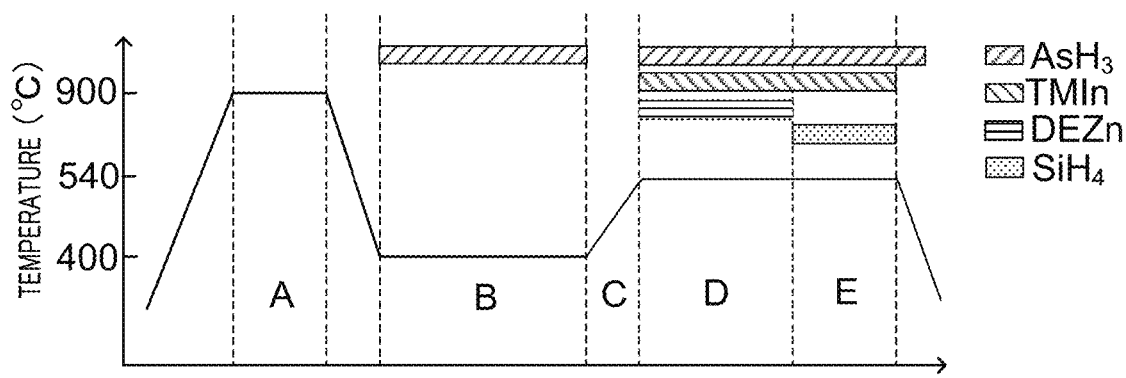
FIG. 4A shows a temperature of the silicon substrate and supply of source gas during production of the group III-V compound semiconductor nanowire in manufacturing of the TFET of the embodiment.
Figure 4B:
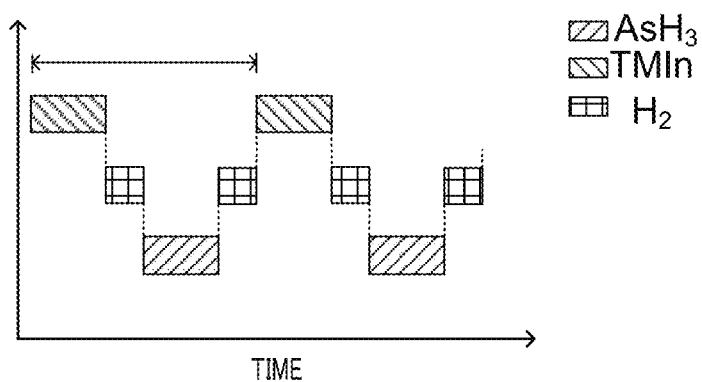
FIG. 4B shows an example of supply of source gas in zone C of FIG. 4A.

The step of converting the (111) surface to the (111) A surface or the (111) B surface can be performed by supplying a group III raw material or a group V raw material to the (111) surface of the IV semiconductor substrate. The step of converting the (111) surface to the (111) A surface or the (111) B surface may be performed after the step of converting the surface of the group IV semiconductor substrate to the (111) 1×1 surface or may be performed simultaneously with the step of converting it to the (111) 1×1 surface. For example, the (111) 1×1 surface can be converted to the (111) A surface or the (111) B surface by converting the (111) 2×1 surface of the group IV semiconductor substrate to the (111) 1×1 surface by the low-temperature heat treatment, and by supplying a group III raw material or a group V raw material to the surface of the IV semiconductor substrate (FIG. 4A and FIG. 4B).

Preferably, the group III raw material is a gas containing boron, aluminum, gallium, indium or titanium (may also be an organic metal compound). The group III raw material is an organic alkyl metal compound such as trimethyl indium. Preferably, the group V raw material is a gas containing nitrogen, phosphor, arsenic, antimony or bismuth (may also be an organic metal compound). The group V raw material is, for example, hydrogenated arsenic (arsine; $AsH_3$). Preferably, the group III raw material or group V raw material is supplied at 400 to 500° C.

In addition, examples of the preparation step include an alternate raw material supply modulation method. The "alternate raw material supply modulation method" is a method of alternately supplying a source gas containing a group III element and a source gas containing a group V element to the group IV semiconductor substrate, and forming a thin film of a group III-V compound semiconductor on the (111) A surface or the (111) B surface exposed through the opening of the insulating film. The alternate raw material supply modulation method can be performed at a temperature necessary to grow the group III-V compound semiconductor nanowire, and preferably, the method is performed at a temperature lower than the temperature necessary to grow the group III-V compound semiconductor nanowire. For example, the alternate raw material supply modulation method may be performed at a temperature of growth of the group III-V compound semiconductor nanowire, or may be performed at approximately 400° C., or, may be performed while raising the temperature from 400° C.

To be more specific, when the (111) A surface is formed on the group IV semiconductor substrate, the raw material gas containing the group III element is supplied first and then the raw material gas containing the group V element is supplied. Furthermore, the raw material gas containing the group III element and the raw material gas containing the group V element are alternately and repeatedly supplied. When the (111) B surface is formed on the group IV semiconductor substrate, the raw material gas containing the group V element is supplied first and then the raw material gas containing the group III element is supplied. Furthermore, the raw material gas containing the group V element and the raw material gas containing the group III element are alternately and repeatedly supplied.

The supply time for the raw material gas containing the group V element and the supply time for the raw material gas containing the group III element may be about several seconds respectively. Furthermore, it is preferable to provide an interval of several seconds between the supply of the raw material gas containing the group V element and the supply of the raw material gas containing the group III element. The raw material gas containing the group V element and the raw material gas containing the group III element may be alternately supplied until the thin film of the group III-V compound semiconductor has a desired thickness. The thin film of the III-V compound semiconductor is formed by repeatedly supplying the gas several times.

The alternate raw material supply modulation method also has a compensation effect of again forming the (111) A surface or the (111) B surface even when there is a portion that could not be converted at the time of conversion of the (111) 1×1 surface of the group IV semiconductor substrate to the (111) A surface or the (111) B surface. This is because the group IV element and group III element or group V element are bonded together by the alternate raw material supply modulation method.

The thin film of the III-V compound semiconductor formed by the alternate raw material supply modulation method can prevent dissociation of the group III element or the group IV element adsorbed to the substrate due to heat when the substrate temperature is raised to grow the semiconductor nanowire after the alternate raw material supply modulation method is performed.

The nanowire growth step includes a step (first region formation step) of intermittently doping either one or both of the first conductivity type dopant and the second conductivity type dopant while supplying the group III raw material and the group V raw material on the (111) surface to form the first region having a pseudo intrinsic property; and a step (second region formation step) of supplying the group III raw material and the group V raw material to the first region formed on the (111) surface, and doping the second conductivity type dopant as necessary to form the second region of the second conductivity type of the other of n-type and p-type such that the second region is continuous from the first region. The "group III-V compound semiconductor nanowire" may include, in addition to the first region and the second region, a portion originating from the raw material of the nanowire which is formed by the above-described nanowire growth preparation step, for example.

In each of the first region formation step and the second region formation step, the growth of the group III-V compound semiconductor nanowire is performed by a method of supplying the group III raw material and the group V raw material onto the (111) surface. For example, the growth of the group III-V compound semiconductor nanowire is performed by a metal-organic chemical vapor phase epitaxy method (hereinafter also referred to as "MOVPE method") or a molecular beam epitaxy method (hereinafter also referred to as "MBE method"). Preferably, the group III-V compound semiconductor nanowire is grown by the MOVPE method.

The semiconductor nanowire can be formed according to the MOVPE method using a normal MOVPE apparatus. That is, a raw material gas containing the group III element and a raw material gas containing the group V element may be provided at a predetermined temperature and under a condition of a reduced pressure. When, for example, an InAs nanowire is formed, a gas containing hydrogenated arsenic ($AsH_3$) and a gas containing trimethyl indium may be provided at approximately 540° C. Furthermore, when a GaAs nanowire is formed, gases containing hydrogenated arsenic and trimethyl gallium may be provided at approximately 750° C. When forming an InGaAs nanowire, gases containing hydrogenated arsenic, trimethylindium, and trimethylgallium may be provided at about 670° C.

In the first region formation step, the group III raw material and the group V raw material are supplied to the above-described (111) surface of the group IV semiconductor substrate. When the thin film is formed by the alternate raw material supply modulation method, the group III raw material and the group V raw material are supplied to the thin film. Typically, the amount of supplying the group III raw material and the group V raw material is fixed. In the first region formation step, the amount of supplying one of the raw materials may be continuously or intermittently changed, or the both raw materials may be intermittently supplied as necessary.

In the first region formation step, along with the supply of the group III raw material and the group V raw material, the first conductivity type dopant or the second conductivity type dopant or both is intermittently doped to form the first region. The first region thus formed has a pseudo intrinsic property. The "pseudo intrinsic property" is the conductivity type of the first region that is determined in accordance with the concentration of the first conductivity type dopant and the second conductivity type dopant in the first region. The pseudo intrinsic property is a conductivity type which is adjusted such that a part of or all of the original conductivity type of the semiconductor is electrically cancelled. The pseudo intrinsic property is obtained by doping the second conductivity type dopant or the first conductivity type dopant into a semiconductor forming the first region, which is the first conductivity type or the second conductivity type even in a non-doped state, for example. The pseudo intrinsic property may be n-type, p-type, or i-type.

It is to be noted that the "i-type" in the pseudo intrinsic property refers to a state where the concentration of the n-type dopant and the concentration of the p-type dopant in the first region are each $1\times10^{15}$ $cm^{-3}$ or smaller, and the resistance value of the first region is 0.1 Ω·cm or greater, for example. The resistance value can be obtained by four-probe voltage-current characteristics, gradient of the current in a nonlinear region of the transistor characteristics, and the like, for example.

The first region may contain the second conductivity type dopant. For example, when the group III raw material or the group V raw material contains a minute amount of organic catalyst, the carbon atoms resulting from the organic catalyst are doped into the first region. The carbon atoms act as an n-type dopant in the group III-V compound semiconductor nanowire.

In this case, from a viewpoint of setting the first region that has the second conductivity type in a non-doped state to the first conductivity type and shifting the gate voltage (for example, shifting from negative to positive), the doping amount of the first conductivity type dopant in the first region formation step is preferably an amount which sets the concentration of the first conductivity type dopant in the first region to a value equal to or greater than $1 \times 10^{14}$ cm$^{-3}$ and smaller than the concentration of the second conductivity type dopant, more preferably an amount which sets the concentration of the first conductivity type dopant in the first region to $1 \times 10^{14}$ to $1 \times 10^{17}$ cm$^{-3}$. In addition, in the first region formation step, the period of time for doping the first conductivity type dopant per doping is preferably 0.1 to 5 seconds, and the interval of the first conductivity type dopant is preferably 1 to 29.5 seconds from the viewpoint of shifting the gate voltage in an appropriate amount.

In the second region formation step, it is preferable to form the second region of the second conductivity type by doping the second conductivity type dopant while supplying the group III raw material and the group V raw material, from the viewpoint of forming the second region of a suitable second conductivity type. Doping of the second conductivity type dopant in the second region formation step may be omitted depending on the conductivity type of the group III-V compound semiconductor nanowire that is formed by supply of the group III raw material and the group V raw material.

Through the above-mentioned procedure, it is possible to form the group III-V compound semiconductor nanowire including the first region and the second region on the (111) surface of the group IV semiconductor substrate such that the longitudinal axis thereof is perpendicular to the (111) surface. When the group III-V compound semiconductor nanowire is formed in this manner, the junction interface basically has neither dislocation nor defect.

In the gate electrode formation step, the gate electrode is formed. For example, the gate electrode may be formed by a method using a photolithography method. In such a method, for example, using a photolithography method, a region other than a portion on which an electrode is to be formed is masked with a resist film, metal such as gold, platinum, titanium, chromium, aluminum, palladium, and molybdenum or semiconductor such as polysilicon is deposited and the resist film is removed (liftoff). In addition, after the deposition of titanium, gold may be further deposited and stacked to form an electrode of a two-layer structure.

As described above, preferably, the gate electrode is arranged on a gate dielectric film. In this case, the gate electrode is formed on the gate dielectric film. The method of forming the gate dielectric film is not limited. For example, a film made of silicon oxide (SiO$_2$), aluminum oxide (Al$_2$O$_3$), hafnium oxide (HfO$_2$) or zirconium oxide (ZrO$_2$) may be formed by an atomic layer deposition (ALD) method or the like.

In the step of forming a source electrode and a drain electrode, the source electrode and the drain electrode are formed. The source electrode and the drain electrode can be formed by a photolithography method as with the gate electrode.

Of the source electrode, the drain electrode and the gate electrode, formation of the source electrode or the drain electrode in the second region of the group III-V compound semiconductor nanowire is performed after the nanowire growth step. However, the timing of formation of electrodes other than the source electrode or the drain electrode in the second region is not limited as long as the electrode can be arranged at a desired position in accordance with the configuration of the TFET.

The TFET of the present invention can be manufactured through the above-mentioned procedure.

According to the above-mentioned method of manufacturing a TFET, a TFET having a desired characteristics can be manufactured by appropriately selecting the kind of the dopant of the first region, and by intermittently doping the dopant.

Hereinafter, an embodiment of a tunnel field effect transistor (TFET) of the present invention will be described in detail with reference to the accompanying drawings.

FIG. 1 is a sectional view illustrating a configuration of a TFET of the embodiment. As illustrated in FIG. 1, TFET 100 of the embodiment includes highly p-doped silicon substrate 110, insulating film 120, group III-V compound semiconductor nanowire 130, gate dielectric film 140, insulating protective film 150, source electrode 160, drain electrode 170 and gate electrode 180.

Silicon substrate 110 is a highly p-doped silicon (111) substrate.

Insulating film 120 is an insulating film that covers a surface ((111) surface) of the two surfaces of p-type silicon substrate 110 on which at least group III-V compound semiconductor nanowire 130 is arranged. Insulating film 120 is a silicon oxide (SiO$_2$) film having a film thickness of 20 nm, for example. The (111) surface of p-type silicon substrate 110 is in direct contact with group III-V compound semiconductor nanowire 130 and forms a junction interface. Insulating film 120 is not present at the interface.

Figure 2A:
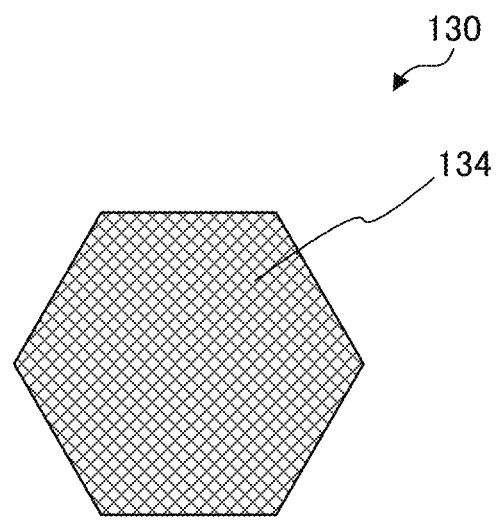
FIG. 2A is a sectional view of a group III-V compound semiconductor nanowire of the embodiment taken along line A-A of FIG. 1.
Figure 2B:
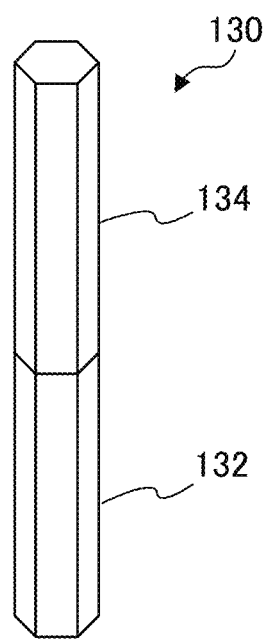
FIG. 2B is a perspective view schematically illustrating the nanowire of the embodiment.

Group III-V compound semiconductor nanowire 130 is a nanowire made of a group III-V compound semiconductor having a diameter of 20 nm and a length of 300 nm, for example. Group III-V compound semiconductor nanowire 130 includes first region 132 in which a p-type dopant is doped, and highly n-doped second region 134. Group III-V compound semiconductor nanowire 130 is arranged on the (111) surface of p-type silicon substrate 110 such that a longitudinal axis thereof is substantially perpendicular to the (111) surface. First region 132 (pseudo intrinsic semiconductor) is located closer to the p-type silicon substrate 110 side (p-type semiconductor) than second region 134 (n-type semiconductor). The junction interface (for example, the (111) surface at the junction part) of first region 132 and p-type silicon substrate 110 basically has neither dislocation nor defect. Group III-V compound semiconductor nanowire 130 has a shape of a hexagonal prism as illustrated in FIG. 2A and FIG. 2B.

Gate dielectric film 140 is an insulating film that covers a surface of insulating film 120 and a side surface of group III-V compound semiconductor nanowire 130 (a side surface of first region 132 and a part of a side surface of second region 134). Gate dielectric film 140 is a high dielectric film such as a hafnium aluminate (HfAlOx) film.

Insulation protective film 150 is a film made of insulating resin such as BCB that covers group III-V compound semiconductor nanowire 130, gate dielectric film 140 and gate electrode 180.

Source electrode 160 is arranged on a rear surface (the surface opposite to the surface on which group III-V compound semiconductor nanowire 130 is arranged) of p-type silicon substrate 110, and is connected with p-type silicon substrate 110 (p-type semiconductor). P-type silicon substrate 110 and source electrode 160 are in direct contact with each other so as to form an interface, and insulating film 120 is not present at the interface. Source electrode 160 is a Ti/Au alloy film formed on the rear surface of p-type silicon substrate 110, for example. Of the two surfaces of p-type silicon substrate 110, source electrode 160 may be arranged on the surface on which group III-V compound semiconductor nanowire 130 is arranged.

Drain electrode 170 is arranged on group III-V compound semiconductor nanowire 130 and insulating protective film 150 and is connected to second region 134 (n-type semiconductor) of group III-V compound semiconductor nanowire 130. Drain electrode 170 is, for example, a Ti/Au alloy film, a Ti/Al/Ti/Au alloy film, or a Ge/Au/Ni/Au alloy film arranged on group III-V compound semiconductor nanowire 130 and insulating protective film 150.

Gate electrode 180 is arranged on gate dielectric film 140 in such a manner as to cover the perimeter of first region 132. Gate electrode 180 is, for example, a W film or a Ti/Au alloy film formed on gate dielectric film 140.

FIG. 3A to FIG. 3F schematically illustrate an exemplary manufacturing method of TFET 100. FIG. 4A to FIG. 4C illustrate exemplary steps of producing group III-V compound semiconductor nanowire 130. Hereinafter, the manufacturing method of TFET 100 is described with reference to FIGS. 3A to 4C.

First, p-type silicon substrate 110 is prepared. Insulating film 120 made of silicon oxide (SiO$_2$) having a film thickness of 20 nm is formed on a surface of p-type silicon substrate 110 by a thermal oxidation method. Opening 122 is formed in insulating film 120. Opening 122 has a diameter of 20 nm, for example. Opening 122 is formed by a photolithography method or the like. It is to be noted that source electrode 160 may be arranged on a rear surface of p-type silicon substrate 110 in advance.

P-type silicon substrate 110 is subjected to a high-temperature heat treatment in which the substrate is kept at a temperature of 900° C. for a certain period. The high-temperature heat treatment is performed under a condition of approximately 900° C. in an atmosphere of inert gas as shown in zone A of FIG. 4A, for example. In FIG. 4A, the broken line indicates the temperature of the substrate. In the embodiment, continuously, the temperature of p-type silicon substrate 100 is kept at approximately 400° C. as described above, a group III element or a group V element is supplied to the (111) surface in order to convert the (111) surface to a (111) A surface or a (111) B surface (see zone B of FIG. 4A). For example, for the purpose of converting the (111) surface to the (111) B surface, AsH$_3$ gas that is a source gas containing a group V element is supplied to the (111) surface while keeping the temperature of the substrate at 400° C., subsequent to the high-temperature heat treatment as illustrated in FIG. 4A. In FIG. 4A, the laterally extended bars indicate the kinds of source gases and the timings for supplying thereof.

Figure 3A:
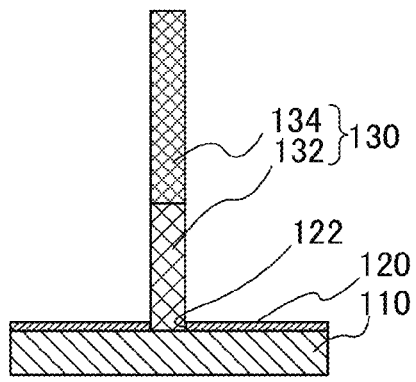
FIG. 3A illustrates a group III-V compound semiconductor nanowire produced on a silicon substrate in manufacturing of the TFET of the embodiment.
Figure 4C:
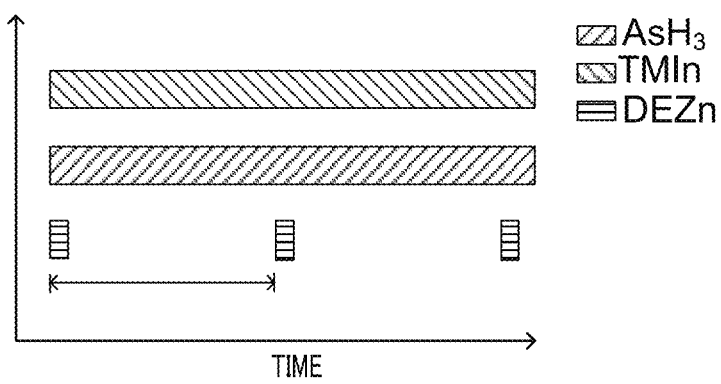
FIG. 4C shows an example of pulse doping of supply of source gas in zone D of FIG. 4A.

Next, as shown in FIG. 3A, group III-V compound semiconductor nanowire 130 is grown from the (111) surface of p-type silicon substrate 110 exposed through opening 122 by an MOVPE method. At this time, it is preferable to form a thin film of a group III-V compound semiconductor on the (111) surface of p-type silicon substrate 110 by an alternate raw material supply modulation method before growing group III-V compound semiconductor nanowire 130.

The alternate raw material supply modulation method is performed in zone C of FIG. 4A. In the alternate raw material supply modulation method, the temperature of the substrate is gradually raised toward the temperature of growth of group III-V compound semiconductor nanowire 130. In addition, in the alternate raw material supply modulation method, source gas containing a group III element and source gas containing a group V element as the base material of group III-V compound semiconductor nanowire 130, which are TMIn (trimethyl indium) gas and AsH$_3$ gas, are alternately supplied as illustrated in FIG. 4B in the embodiment.

For example, the supply time for each source gas is two seconds, and the interval of the supply of each source gas is one second. During the interval, hydrogen gas is supplied to the (111) surface. In the alternate raw material supply modulation method, as indicated with the arrow in FIG. 4B, a combination of single supply of each of TMIn gas and AsH$_3$ gas and supply of hydrogen gas subsequent to the supply of each of TMIn gas and AsH$_3$ gas as one cycle is repeated multiple times (for example 30 times).

Next, first region 132 of group III-V compound semiconductor nanowire 130 is grown. First region 132 is grown in zone D of in FIG. 4A. During the growth of first region 132, the temperature of the substrate is kept at a certain temperature (for example 540° C.). During the growth of first region 132, DEZn (diethyl zinc) gas is intermittently supplied to dope Zn as the p-type dopant to first region 132 while continuously supplying AsH$_3$ gas and TMIn gas as the base material as illustrated in FIG. 4C.

For example, the DEZn gas is supplied for X seconds while the AsH$_3$ gas and the TMIn gas are being supplied for 30 seconds. That is, the DEZn gas is supplied for X seconds at an interval of (30-X) seconds. As long as the compensation doping effect can be obtained in first region 132, the supply time X of the DEZn gas may be appropriately set, and for example, may be set to 0.5 to 5 seconds. The supply time X may be fixed or changed in zone D. During the growth of first region 132, the DEZn gas is supplied one time with one interval in one cycle as indicated with the arrow in FIG. 4C, the cycle is repeated multiple times (for example 30 times).

Next, second region 134 of group III-V compound semiconductor nanowire 130 is grown. Second region 134 is grown in zone E of FIG. 4A. Also during the growth of second region 134, the temperature of the substrate is kept at a certain temperature (for example 540° C.). During the growth of second region 134, together with AsH$_3$ gas and TMIn gas as the base material, SiH$_4$ gas is continuously supplied to dope Si as the n-type dopant to second region 134 as illustrated in FIG. 4A in the embodiment.

Figure 3B:
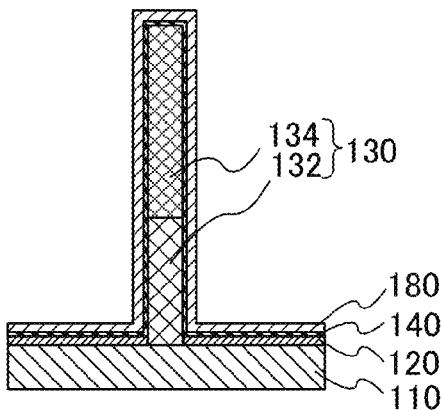
FIG. 3B illustrates the group III-V compound semiconductor nanowire covered with a gate dielectric film and a gate electrode layer in the manufacturing of TFET.

After first region 132 and second region 134 are formed, a surface of insulating film 120 and a surface of group III-V compound semiconductor nanowire 130 are covered with gate dielectric film 140, and then gate dielectric film 140 is covered with gate electrode 180 as illustrated in FIG. 3B. Gate dielectric film 140 is formed by an ALD method, for example. Gate electrode 180 is formed by a sputtering method, for example.

Figure 3C:
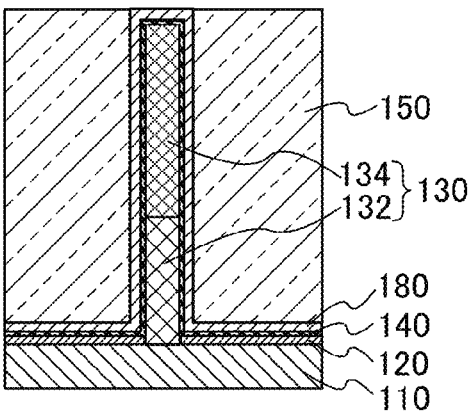
FIG. 3C illustrates the group III-V compound semiconductor nanowire embedded in an insulation protective film.

Next, as illustrated in FIG. 3C, insulation protective film 150 is formed on a surface of p-type silicon substrate 110. Insulation protective film 150 is formed by a spin coating method, for example.

Figure 3D:
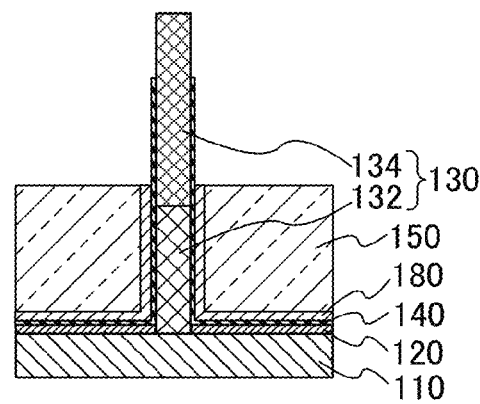
FIG. 3D illustrates the gate dielectric film and the group III-V compound semiconductor nanowire exposed from the partially removed insulation protective film.

Next, as illustrated in FIG. 3D, each of insulation protective film 150, gate electrode 180 and gate dielectric film 140 is partially removed to expose a tip (an end portion of second region 134) of group III-V compound semiconductor nanowire 130 and gate dielectric film 140. Such partial removal is performed by a reactive ion etching (reactive ion etching).

Figure 3E:
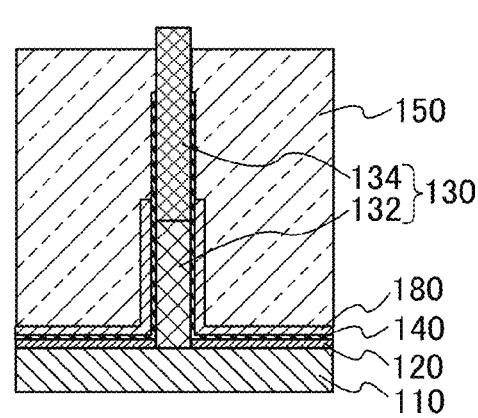
FIG. 3E illustrates the group III-V compound semiconductor nanowire exposed from the insulation protective film.
Figure 3F:
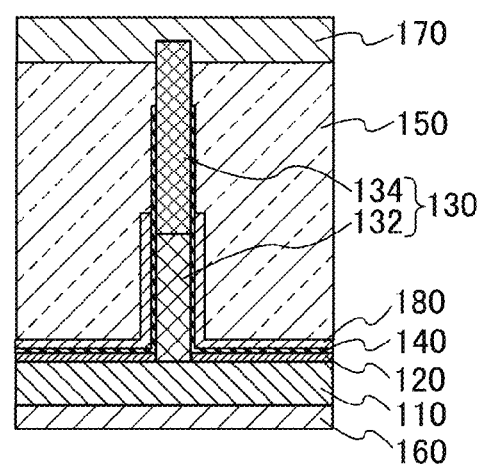
FIG. 3F illustrates a complete TFET after formation of the source electrode and the drain electrode.

Next, as illustrated in FIG. 3E, after insulation protective film 150 is formed, the tip of group III-V compound semiconductor nanowire 130 is again exposed. Thereafter, as illustrated in FIG. 3F, drain electrode 170 is formed on the surface of insulation protective film 150, and source electrode 160 is formed on a rear surface of p-type silicon substrate 110. Drain electrode 170 and source electrode 160 are formed by a vacuum deposition, for example.

In TFET 100, the bonded surface of first region 132 of group III-V compound semiconductor nanowire 130 and the (111) surface of silicon substrate 110 functions as a tunnel layer. As shown in FIG. 5A, in TFET 100, carriers in p-type silicon substrate 110 move into group III-V compound semiconductor nanowire 130 (ON state is established) through a tunnel phenomenon when a positive bias is applied to gate electrode 180. This operation corresponds to a switch operation of an n-type MOSFET of a CMOS switch.

In addition, TFET 100 includes highly p-doped silicon substrate 110, p-doped first region 132, and n-doped second region 134. Thus, the gate voltage can be shifted to the positive side in comparison with a TFET having a non-doped first region as described later in Examples.

In addition, since the threshold voltage is shifted to the positive side or the negative side by appropriately adjusting the conductivity type of the first region in the group III-V compound semiconductor nanowire, the supply voltage required for an ON state can be arbitrarily controlled by changing the kind of the group III-V compound semiconductor.

Furthermore, since insulating protective film 150 covers the periphery of group III-V compound semiconductor nanowire 130, a plurality of TFETs 100 can be integrated.

While a highly p-doped silicon substrate is used as silicon substrate 110 in TFET 100, the TFET of the present invention may be produced using a highly n-doped silicon (111) substrate. In this case, an n-type dopant is intermittently doped to first region 132, and a p-type dopant is continuously doped to second region 134. In the TFET thus produced, the bonded surface of the first region of the group III-V compound semiconductor nanowire and the (111) surface of the n-type silicon substrate functions as a tunnel layer.

As shown in FIG. 5B, in the TFET, carriers in the n-type silicon substrate move into the group III-V compound semiconductor nanowire (ON state is established) through a tunnel phenomenon when a negative bias is applied to the gate electrode. This operation corresponds to a switch operation of a p-type MOSFET of a CMOS switch. In addition, the above-mentioned TFET can shift a gate voltage to the negative side in comparison with a TFET having a non-doped first region.

According to the embodiment, a TFET and a switch element which can operate with a small subthreshold (60 mV/digit or smaller) can be provided. In addition, according to the embodiment, it is possible to readily manufacture a TFET and a switch element which operate with a more shifted rising voltage on the positive side in the case where a current value increases with a positive gate voltage, and can operate with a more shifted rising voltage on the negative side in the case where a current value increases with a negative gate voltage.

EXAMPLE

Hereinafter, the present invention will be described in detail with reference to Examples, but the present invention is not limited to Examples.

First, a conventional TFET (TFET-A) was produced by the method described below.

Comparative Example 1

Production of TFET-A

1) Preparation of Substrate

A p-type silicon (111) substrate (carrier concentration: $7 \times 10^{18}$ cm$^{-3}$) was subjected to thermal oxidation processing and a silicon oxide film having a film thickness of 20 nm was formed on the surface thereof. Openings are periodically formed in the silicon oxide film by electron beam lithography and wet chemical etching and the surface of the silicon substrate was exposed therethrough. The shape of the opening was hexagonal and the equivalent circle diameter of the opening was 100 nm.

2) Production of InAs Nanowire

The substrate in which the openings were formed was set on a sub-atmospheric transverse MOVPE apparatus (HR2339; TAIYO NIPPON SANSO CORPORATION). The internal temperature of the MOVPE apparatus was raised to 925° C., and kept for five minutes to thereby remove a natural oxide film formed on the opening surface of the silicon substrate. Next, the internal temperature of the apparatus was lowered from 925° C. to 400° C. Hydrogenated arsenic was supplied together with a hydrogen gas (carrier gas). The partial pressure of hydrogenated arsenic was $1.3 \times 10^{-4}$ atm.

Next, a thin film of InAs was formed at the opening of the silicon substrate by the alternate raw material supply modulation method. To be more specific, a combination of 2-second supply of trimethyl indium, 1-second interval using a hydrogen gas, 2-second supply of hydrogenated arsenic and 1-second interval using a hydrogen gas as one cycle was repeated 20 times over two minutes. The partial pressure of trimethyl indium was $9.6 \times 10^{-7}$ atm and the partial pressure of hydrogenated arsenic was $2.5 \times 10^{-4}$ atm.

Next, after raising the inner temperature of the apparatus, the InAs nanowire was grown until a length of 800 nm by an MOVPE method. To be more specific, the inner temperature of the apparatus was raised from 400° C. to 540° C., and trimethyl indium and hydrogenated arsenic were supplied together with a hydrogen gas and an InAs nanowire (first region; carrier concentration: $2 \times 10^{17}$ cm$^{-3}$) was grown until a length of 500 nm Next, trimethyl indium hydrogenated arsenic and monosilane were supplied together with the hydrogen gas, and an n-type InAs nanowire having a length of 300 nm (second region; carrier concentration: $2 \times 10^{19}$ cm$^{-3}$) was grown. The partial pressure of trimethyl indium was $4.9 \times 10^{-7}$ atm, the partial pressure of hydrogenated arsenic was $1.3 \times 10^{-4}$ atm and the partial pressure of monosilane was $7 \times 10^{--8}$ atm.

3) Production of TFET

A gate dielectric film was formed on the silicon substrate and the side surface of the InAs nanowire, and a gate electrode was further formed thereon. To be more specific, an Hf$_{0.8}$Al$_{0.2}$O film (gate dielectric film) having a film thickness of 20 nm was formed by an ALD method. Thereafter, a W film (gate electrode) having a film thickness of 100 nm was formed by a high frequency sputtering method.

Next, an insulating resin (BCB resin) film was formed on the dielectric film on the silicon substrate and the InAs nanowire on the silicon substrate was embedded in the insulating resin. Next, part of the top side of the insulating resin was removed by reactive ion etching and the tip of the InAs nanowire was exposed.

Next, a multilayer film of Ti (20 nm)/Au (100 nm) having a film thickness of 120 nm was formed as a drain electrode on the surface where the InAs nanowire was exposed. Furthermore, a multilayer film of Ti (20 nm)/Au (30 nm) having a film thickness of 50 nm was formed as a source electrode on the silicon substrate. In this manner, the TFET-A was produced.

Next, TFETs (TFET-B and TFET-C) according to the present invention were produced.

Example 1

Production of TFET-B

TFET-B was produced as with TFET-A except that diethyl zinc was intermittently supplied along with successive supply of trimethyl indium and hydrogenated arsenic during the growth of the first region. During supply of diethyl zinc, a combination of 1-second supply and 29-second interval as one cycle was repeated 30 times. The partial pressure of diethyl zinc was $3\times10^{-7}$ atm. The concentration of dopant (Zn) in the first region of TFET-B was $3\times10^{15}$ cm$^{-3}$. It is to be noted that the concentration was obtained by producing the InAs nanowire in a non-doped state on an n-type silicon substrate, producing a vertical FET structure, and calculating the concentration from the threshold voltage of the nanowire.

Example 2

Production of TFET-C

TFET-C was produced as with TFET-B except that a combination of 2-second supply and 28-second interval was used as one cycle of supply of diethyl zinc. The concentration of the dopant (Zn) in the first region of TFET-C was $6\times10^{15}$ cm$^{-3}$.

Figure 6A:
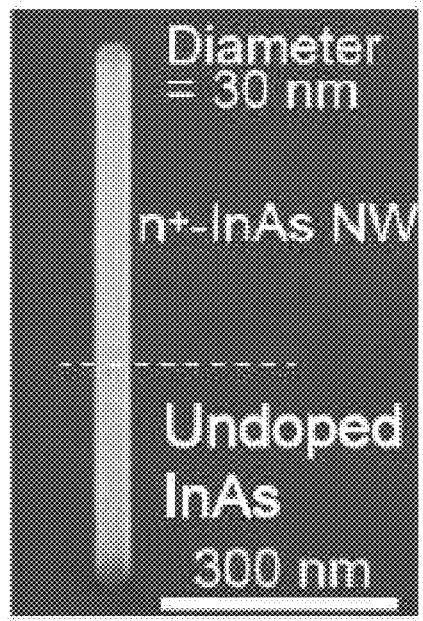
FIG. 6A is a scanning electron microscope photograph of a group III-V compound semiconductor nanowire in an exemplary conventional TFET.
Figure 6B:
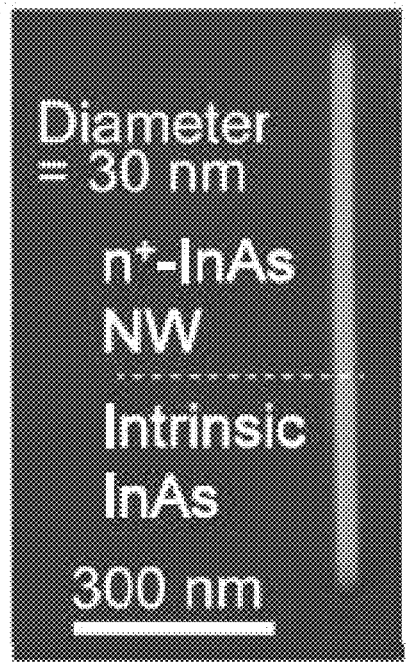
FIG. 6B is a scanning electron microscope photograph of an exemplary group III-V compound semiconductor nanowire of the TFET of the present invention.

FIG. 6A is a scanning electron microscope photograph of the InAs nanowire of TFET-A, and FIG. 6B is a scanning electron microscope photograph of the InAs nanowire of TFET-B. As shown in FIGS. 6A and 6B, the nanowires were grown in a direction perpendicular to the (111) surface of the silicon substrate.

Relationships of the drain current in response to application of gate voltage in TFET-A, TFET-B and TFET-C produced by the above-mentioned steps were determined Results of the measurements are illustrated in FIG. 7.

In FIG. 7, curve A indicates electrical characteristics of TFET-A. As is obvious from curve A, the subthreshold characteristic of TFET-A was 21 mV/digit. The subthreshold lower than 60 mV/digit proves that TFET-A is a tunnel FET. It should be noted that the rising voltage of TFET-A was −0.4 V.

In FIG. 7, curve B indicates electrical characteristics of TFET-B, and shows characteristics of the tunnel FET under a condition of 1-second Zn-pulse doping and 29-second interval. In addition, curve C indicates electrical characteristics of TFET-C, and shows characteristics of the tunnel FET under a condition of 2-second Zn-pulse doping and 28-second interval. As is obvious from curve B, the rising voltage of TFET-B was 0.3 V, and the subthreshold of TFET-B was 30 mV/digit. In addition, as is obvious from curve C, the rising voltage of TFET-C was 0.6 V, and the subthreshold of TFET-C was 30 mV/digit.

From the above-mentioned results, it was confirmed that the rising voltage is shifted to the positive side in comparison with TFET-A in which Zn was not doped in the first region, that a steep subthreshold which is a feature of the tunnel FET can be maintained, and that the rising voltage can be adjusted by the supply time of dopant in the pulse doping in each of TFET-B and TFET-C having the first region in which Zn is doped.

It can be said that the reason of the negative rising voltage in TFET-A is the presence of dopant in source gas. That is, when a non-doped InAs nanowire is produced, carbon atoms originating from organic metal is added to the first region and the second region at a concentration of about $10^{16}$ to $10^{17}$ cm$^{-3}$. This acts as the n-type dopant.

In contrast, in TFET-B and TFET-C, Zn atoms which act as a p-type dopant of the III-V semiconductor were added by a pulse doping method. That is, during the growth of a non-doped layer, a cycle of a combination of 1 or 2-second supply and 29 or 28-second interval was repeated at a partial pressure of about $3\times10^{-7}$ atm. When Zn atoms are successively added in an amount same as the above-mentioned amount, the concentration of the Zn atoms in the nanowire is $1\times10^{18}$ cm$^{-3}$.

However, by supplying Zn atoms by a pulse doping method, a Zn concentration of $10^{15}$ to $10^{16}$ cm$^{-3}$ is achieved in a structure of a nanometer scale. By such doping of a proper p-type dopant, it is possible to obtain a compensation effect (compensation doping effect) for carbon atoms as a dopant which acts as an n-type dopant. With such a compensation effect, the non-doped InAs nanowire becomes further electrically neutral. Thus, for example, a nano structure (pseudo intrinsic layer) having an electrical property comparable to that of an intrinsic layer can be produced.

In addition, TFETs were produced by methods described below.

Comparative Example 2

Production of TFET-D

The natural oxide film was removed from the p-type silicon (111) substrate as with Comparative example 1. Then the inner temperature of a sub-atmospheric transverse MOVPE apparatus was lowered from 925° C. to 670° C., and hydrogenated arsenic was supplied together with hydrogen gas (carrier gas) (zone B of FIG. 8A). The partial pressure of hydrogenated arsenic was $1.3\times10^{-4}$ atm.

Figure 8A:
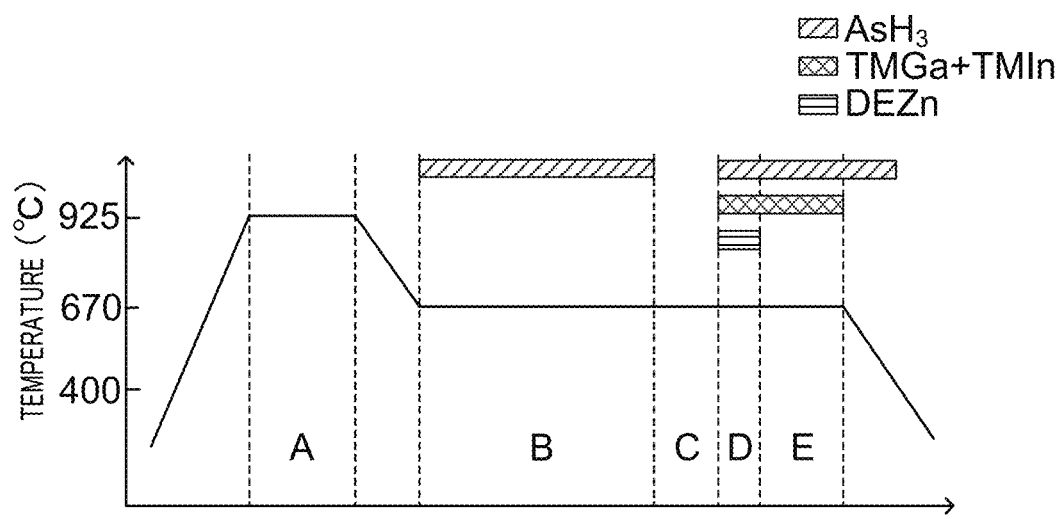
FIG. 8A schematically illustrates a temperature of a silicon substrate and supply of source gas in manufacturing of TFETs of Examples 3 and 4.

Next, an InGaAs thin film was formed at the opening of the silicon substrate by the alternate raw material supply modulation method (zone C of FIG. 8A). To be more specific, an InGaAs thin film was formed at the opening as with TFET-A except that a mixed gas of trimethyl indium and trimethyl gallium was supplied in place of trimethyl indium. The partial pressure of trimethyl indium was $9.7\times10^{-7}$ atm, the partial pressure of trimethyl gallium was $5.7\times10^{-7}$ atm, and the partial pressure of hydrogenated arsenic was $6.0\times10^{-4}$ atm.

Next, an InGaAs nanowire was grown until a length of 800 nm by a MOVPE method as with TFET-A except that the mixed gas was used in place of trimethyl indium while the inner temperature of the apparatus was kept at 670° C. The length of the first region was 500 nm, and the carrier density during the formation of the first region was $6\times10^{16}$ cm$^{-3}$. In addition, the length of the second region was 300 nm, and the carrier density during the formation of the second region was $1\times10^{18}$ cm$^{-3}$. The partial pressure of trimethyl indium was $9.7\times10^{-7}$ atm, the partial pressure of trimethyl gallium was $5.7\times10^{-7}$ atm, the partial pressure of hydrogenated arsenic was $6.0\times10^{-4}$ atm, and the partial pressure of monosilane was $6.0\times10^{-8}$ atm.

Next, as with TFET-A, a gate dielectric film, a gate electrode, an insulation resin (BCB resin) film, a drain electrode and a source electrode were formed, and thus TFET-D was produced. In TFET-D, the conductivity type of the first region was n--type (n negative type), and the conductivity type of the second region was n+-type (n positive type).

Example 3

Production of TFET-E

Figure 8B:
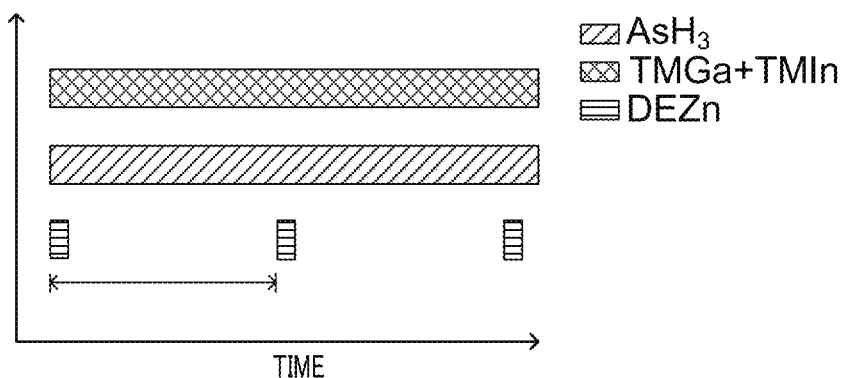
FIG. 8B schematically illustrates pulse doping of supply of source gas in zone D of FIG. 8A.

FIG. 8A schematically illustrates a temperature of a silicon substrate and supply of a source gas in manufacturing of a TFET in Examples 3 and 4, and FIG. 8B schematically illustrates pulse doping for supplying a source gas in zone D of FIG. 8A.

TFET-E was produced as with TFET-D except that diethyl zinc was intermittently supplied (zone D of FIG. 8A and FIG. 8B) along with successive supply of the mixed gas and hydrogenated arsenic during growth of the first region. Diethyl zinc was supplied in a cycle same as that of TFET-B. That is, a combination of 1-second supply of diethyl zinc and 29-second interval as one cycle was repeated 30 times. The partial pressure of diethyl zinc was $5 \times 10^{-7}$ atm. The concentration of the dopant (Zn) in the first region of TFET-E was $2 \times 10^{15}$ cm$^{-3}$. In TFET-E, the conductivity type of the first region was i-type, and the conductivity type of the second region was n+-type.

Example 4

Production of TFET-F

TFET-F was produced as with TFET-E except that a combination of 2-second supply and 28-second interval was used as one cycle of supply of diethyl zinc. The concentration of dopant (Zn) in the first region of TFET-F was $2 \times 10^{15}$ cm$^{-3}$. In TFET-F, the conductivity type of the first region was i-type, and the conductivity type of the second region was n+-type.

Figure 9:
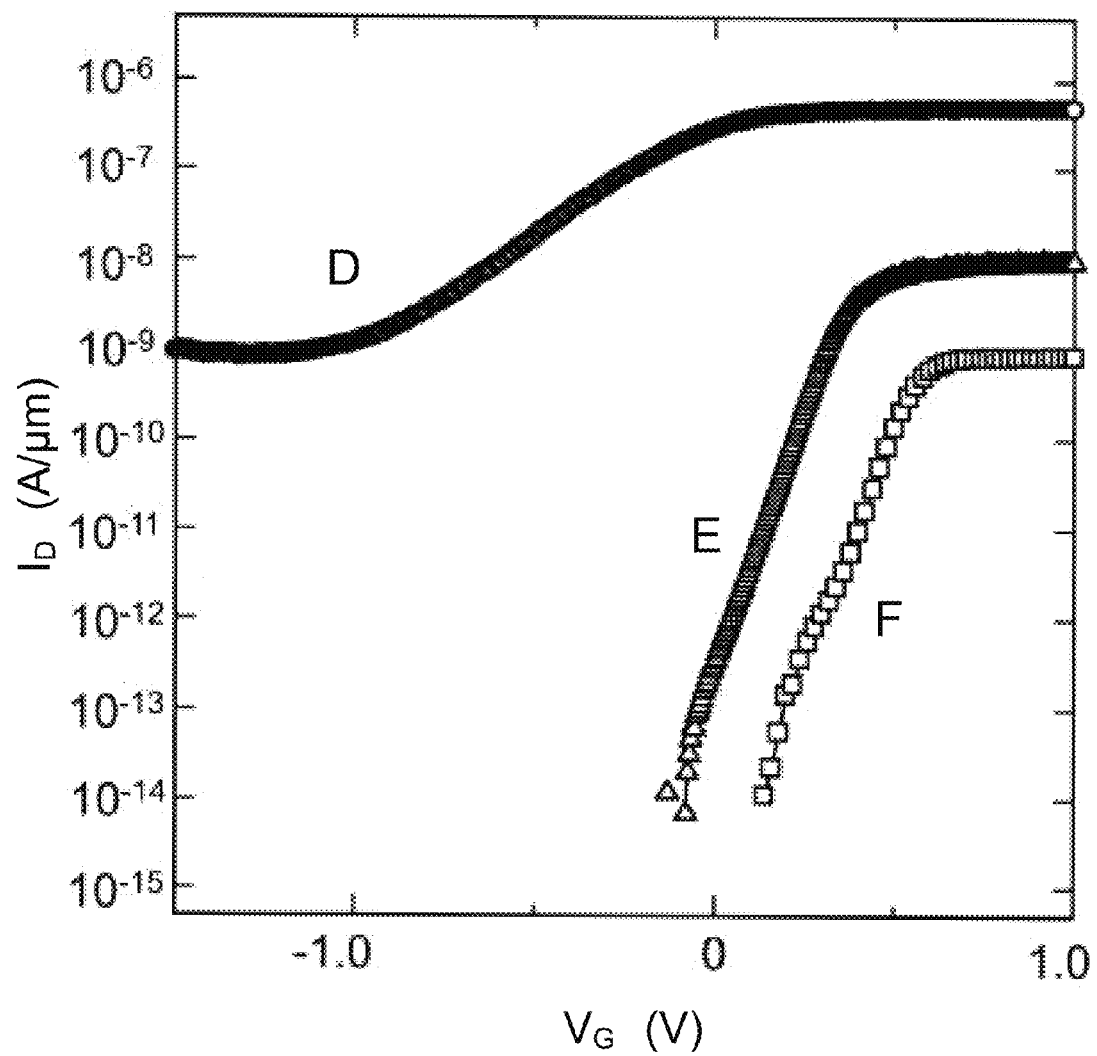
FIG. 9 illustrates relationships between the drain current and the gate voltage in the TFETs of Examples 3 and 4 and a conventional TFET (of Comparative example 2).

Relationships of the drain current in response to application of gate voltage in TFET-D, TFET-E and TFET-F were determined. Results of the measurements are illustrated in FIG. 9. In FIG. 9, curve D indicates the electrical characteristics of TFET-D, curve E indicates the electrical characteristics of TFET-E, and curve F indicates the electrical characteristics of TFET-F, respectively.

As is obvious from curve D, the subthreshold characteristic of TFET-D (subthreshold) was 380 mV/digit, and the rising voltage of TFET-D was −1.0 V. In contrast, as is obvious from curve E, the subthreshold of TFET-E was 58 mV/digit, and the rising voltage of TFET-E was −0.05 V. In addition, as is obvious from curve F, the subthreshold of TFET-F was 55 mV/digit, and the rising voltage of TFET-F was +0.2 V.

As with Examples 1 and 2, from the above-mentioned results, it can be said that the rising voltage is shifted to the positive side in comparison with TFET-D in which Zn was not doped in the first region, and that a steep subthreshold which is a feature of the tunnel FET can be ensured in each of TFET-E and TFET-F having the first region in which Zn is doped. In addition, it can be said that the rising voltage can be adjusted by the supply time of dopant in pulse doping.

The disclosure of the specification, drawings, and abstract in Japanese Patent Application No. 2013-168048 filed on Aug. 13, 2013 is incorporated herein by reference in its entirety.

INDUSTRIAL APPLICABILITY

The TFET of the present invention is useful as a switch element formed on a semiconductor microprocessor or a large scale integrated circuit, for example. In particular, a gate voltage can be shifted to the positive side in the case of an n-channel transistor in which a current flows with a positive gate voltage, and a gate voltage can be shifted to the negative side in the case of a p-channel transistor in which a current flows with a negative gate voltage. Thus, the amount of the drain current when the gate voltage is zero can be further reduced. Consequently, the leakage power in a standby state can be further reduced, which is advantageous in terms of power saving, for example.

REFERENCE SIGNS LIST

100 TFET
110 p-type silicon substrate
120 Insulating film
122 Opening
130 Group III-V compound semiconductor nanowire
132 First region
134 Second region
140 Gate dielectric film
150 Insulation protective film
160 Source electrode
170 Drain electrode
180 Gate electrode

The invention claimed is:

1. A method of manufacturing a tunnel field effect transistor comprising:
   growing a group III-V compound semiconductor nanowire on a (111) surface of a portion of a first conductivity type of a group IV semiconductor substrate, the first conductivity type being one of n-type and p-type;
   forming a gate electrode configured to apply an electric field for controlling flow of a carrier between a source electrode and a drain electrode to an interface between the group IV semiconductor substrate and the group III-V compound semiconductor nanowire;
   forming one of the source electrode and the drain electrode on the group IV semiconductor substrate such that the one of the source electrode and the drain electrode is not in contact with the group III-V compound semiconductor nanowire; and
   forming the other of the source electrode and the drain electrode on the group III-V compound semiconductor nanowire, wherein:
   the growing further includes:
     forming a first region by intermittently doping either one or both of a first conductivity type dopant for setting the group III-V compound semiconductor to the first conductivity type and a second conductivity type dopant for setting the group III-V compound semiconductor to a second conductivity type on the (111) surface while supplying a group III raw material and a group V raw material, the second conductivity type being the other of the n-type and the p-type, and forming a second region of the second conductivity type by further supplying the group V raw material and the group III raw material to the first region formed on the (111) surface, the second region being continuous from the first region.

2. The method according to claim 1, wherein:
the first region contains the second conductivity type dopant; and,
in the forming of the first region, the first conductivity type dopant is intermittently supplied to the (111) surface such that a concentration of the first conductivity type dopant in the first region is $1 \times 10^{14}$ to $1 \times 10^{17}$ cm$^{-3}$.

3. The method according to claim 1, wherein, in the forming of the first region, the first conductivity type dopant is doped for 0.1 to 5 seconds per doping at an interval of 1.0 to 29.5 seconds.

4. The method according to claim 1, wherein, in the forming of the second region, the second region of the second conductivity type is formed by doping the second conductivity type dopant to the first region formed on the (111) surface while supplying the group V raw material and the group III raw material.

5. A method of manufacturing a group III-V compound semiconductor nanowire by growing a group III-V compound semiconductor nanowire on a (111) surface of a portion of a first conductivity type of a group IV semiconductor substrate, the first conductivity type being one of n-type and p-type, wherein the method comprises:
forming a first region by intermittently doping either one or both of a first conductivity type dopant for setting the group III-V compound semiconductor to the first conductivity type and a second conductivity type dopant for setting the group III-V compound semiconductor to a second conductivity type on the (111) surface while supplying a group III raw material and a group V raw material, the second conductivity type being the other of the n-type and the p-type, and
forming a second region of the second conductivity type by further supplying the group V raw material and the group III raw material to the first region formed on the (111) surface, the second region being continuous from the first region.

6. The method according to claim 5, wherein:
the first region contains the second conductivity type dopant; and,
in the forming of the first region, the first conductivity type dopant is intermittently supplied to the (111) surface such that a concentration of the first conductivity type dopant in the first region is $1 \times 10^{14}$ to $1 \times 10^{17}$ cm$^{-3}$.

7. The method according to claim 5, wherein, in the forming of the first region, the first conductivity type dopant is doped for 0.1 to 5 seconds per doping at an interval of 1.0 to 29.5 seconds.

8. The method according to claim 5, wherein, in the forming of the second region, the second region of the second conductivity type is formed by doping the second conductivity type dopant to the first region formed on the (111) surface while supplying the group V raw material and the group III raw material.

9. A method of manufacturing a tunnel field effect transistor comprising:
growing a group III-V compound semiconductor nanowire by the method of manufacturing a group III-V compound semiconductor nanowire according to claim 8 on a (111) surface of a portion of a first conductivity type of a group IV semiconductor substrate, the first conductivity type being one of n-type and p-type;
forming a gate electrode configured to apply an electric field for controlling flow of a carrier between a source electrode and a drain electrode to an interface between the group IV semiconductor substrate and the group III-V compound semiconductor nanowire;
forming one of the source electrode and the drain electrode on the group IV semiconductor substrate such that the one of the source electrode and the drain electrode is not in contact with the group III-V compound semiconductor nanowire; and
forming the other of the source electrode and the drain electrode on the group III-V compound semiconductor nanowire, wherein:
the growing further includes:
forming a first region by intermittently doping either one or both of a first conductivity type dopant for setting the group III-V compound semiconductor to the first conductivity type and a second conductivity type dopant for setting the group III-V compound semiconductor to a second conductivity type on the (111) surface while supplying a group III raw material and a group V raw material, the second conductivity type being the other of the n-type and the p-type, and
forming a second region of the second conductivity type by further supplying the group V raw material and the group III raw material to the first region formed on the (111) surface, the second region being continuous from the first region.

10. The method according to claim 9, wherein:
the first region contains the second conductivity type dopant; and,
in the forming of the first region, the first conductivity type dopant is intermittently supplied to the (111) surface such that a concentration of the first conductivity type dopant in the first region is $1 \times 10^{14}$ to $1 \times 10^{17}$ cm$^{-3}$.

11. The method according to claim 9, wherein, in the forming of the first region, the first conductivity type dopant is doped for 0.1 to 5 seconds per doping at an interval of 1.0 to 29.5 seconds.

12. The method according to claim 9, wherein, in the forming of the second region, the second region of the second conductivity type is formed by doping the second conductivity type dopant to the first region formed on the (111) surface while supplying the group V raw material and the group III raw material.

* * * * *